United States Patent
Inokuchi

(10) Patent No.: US 7,671,332 B2
(45) Date of Patent: Mar. 2, 2010

(54) AUTOFOCUS METHOD FOR SCANNING CHARGED-PARTICLE BEAM INSTRUMENT

(75) Inventor: Masayuki Inokuchi, Tokyo (JP)

(73) Assignee: JEOL Ltd., Tokyo (JP)

( * ) Notice: Subject to any disclaimer, the term of this patent is extended or adjusted under 35 U.S.C. 154(b) by 158 days.

(21) Appl. No.: 12/117,819

(22) Filed: May 9, 2008

(65) Prior Publication Data

US 2008/0283766 A1 Nov. 20, 2008

(30) Foreign Application Priority Data

May 15, 2007 (JP) ............................. 2007-128760

(51) Int. Cl.
*H01J 37/21* (2006.01)
(52) U.S. Cl. ............................................. 250/310
(58) Field of Classification Search ............... 250/310
See application file for complete search history.

(56) References Cited

U.S. PATENT DOCUMENTS 5,404,012 A 4/1995 Yamada

| | | | |
|---|---|---|---|
| 6,653,633 B2 * | 11/2003 | Takane et al. | ........... 850/10 |
| 2006/0060781 A1 * | 3/2006 | Watanabe et al. | ........... 250/310 |
| 2008/0073526 A1 * | 3/2008 | Takane et al. | ........... 250/307 |

FOREIGN PATENT DOCUMENTS

| JP | 5114378 | 5/1993 |
|---|---|---|
| JP | 11073903 | 3/1999 |

* cited by examiner

Primary Examiner—Kiet T Nguyen
(74) Attorney, Agent, or Firm—The Webb Law Firm

(57) ABSTRACT

An autofocus method for bringing an electron beam into focus on a specimen. Characteristics of the brightness at plural kinds of focus values are found for sets of data. The characteristics are accumulated creating a focus function. The focus function is approximated by a quadratic curve. The focus value at the peak point is found from the quadratic curve. Based on the focus value, the focal condition of the beam is set.

14 Claims, 10 Drawing Sheets

AUTOFOCUS METHOD FOR SCANNING CHARGED-PARTICLE BEAM INSTRUMENT

BACKGROUND OF THE INVENTION

1. Field of the Invention

The present invention relates to an autofocus method of precisely focusing a beam even onto a flat specimen having no edges in a scanning charged-particle beam instrument.

2. Description of Related Art

Autofocusing is achieved in a scanning electron microscope by scanning an electron beam over a specimen region, deriving secondary electrons from the region, evaluating variations in the brightness produced at successive scan positions, and feeding the result of the evaluation back to control the focal distance of the focusing lens (e.g., objective lens) of the scanning electron microscope.

FIGS. 9A and 9B illustrate electron beam scanning performed when an automatic focusing operation is performed. FIG. 9A shows one example of vector scanning, and FIG. 9B shows one example of raster scanning.

The graph of FIG. 10 shows the brightness of a secondary electron signal obtained at each electron beam scan position. The brightness is plotted on the vertical axis. The scan position is plotted on the horizontal axis.

Such scanning of the electron beam over a specimen region is performed at various focus values. Whenever the value is varied, the relationship between the beam scan position and the brightness signal is found and acquired. The signal is differentiated at each focus value. A focus value resulting in a maximum sum of values obtained by differentiation is taken as an optimum focus value.

FIG. 11 is a block diagram of an example of configuration of an autofocus system for use in a scanning electron microscope. The microscope has an electron gun 1 emitting an electron beam 2, which, in turn, is focused to a small diameter onto a specimen 5 by an objective lens 4. A desired region of the specimen 5 is scanned by the beam, using a deflector 3. At this time, secondary electrons are produced from the specimen 5 and detected by a secondary electron detector 6. The output signal from the detector 6 corresponding to the detected secondary electrons is converted into digital image data by an A/D converter (ADC) 7.

A microcomputer 10 is made up of an evaluation portion 11, an arithmetic-and-control portion 12, and a scanning signal-generating portion 13. The output signal from the scanning signal-generating portion 13 is sent to a deflection driver circuit 9, which, in turn, drives the deflector 3. Therefore, the electron beam can perform two-dimensional scanning over the specimen 5.

The output signal from the A/D converter 7 is entered into the evaluation portion 11, where the signal is evaluated. The result of the evaluation is sent to the arithmetic-and-control portion 12, which calculates an amount of feedback based on the result of the evaluation made by the evaluation portion 11 and outputs the calculated amount (value). The output signal from the arithmetic-and-control portion 12 is input to a focal distance driver circuit 8.

In operation, the electron beam 2 passes through the objective lens 4 and hits the specimen 5. The objective lens 4 is excited with an excitation current based on the output signal from the focal distance driver circuit 8. At this time, secondary electrons produced from the specimen 5 are detected by the secondary electron detector 6. The output signal from the detector 6 indicative of the detected secondary electrons is converted into digital image data by the A/D converter 7 and applied to the evaluation portion 11.

The evaluation portion 11 is measuring the detector output signal indicative of the detected secondary electrons. The measured value is supplied to the arithmetic-and-control portion 12. The arithmetic-and-control portion 12 drives the focal distance driver circuit 8 in such a way that the objective lens 4 is excited with an excitation current which brings the beam 2 into sharp focus onto the specimen 5. In this way, the automatic focusing operation is carried out.

A known technique for this kind of system is described, for example, in JP1173903. In particular, an automatic focusing operation is performed using a whole field of image. Then, the detector output signal indicative of the whole field of image is stored in a memory. The stored signal is read out. The signal is accumulated in every subregion obtained by division by a data accumulation unit. The automatic focusing operation is repeated in areas where the accumulation values are high among the subregions.

Another known technique is described, for example, in JP5114378. Specifically, a deflection coil is driven with a vertical scan signal to which a horizontal scan signal and a sawtoothed wave are added. During the period of one horizontal scan signal, the scanning is repeatedly done at short intervals in the vertical direction, using the sawtoothed wave. Secondary electrons produced from the specimen by the scanning are detected, whereby an automatic focusing operation is performed.

In order to operate the autofocus system shown in FIG. 11, the brightness must be varied in a corresponding manner to the beam scan position as shown in FIG. 10. However, when the electron beam is scanned over the specimen, if the line on the specimen hit by the beam happens to have no structural object thereon, if the beam deviates from the scanned line due to fine dust, or if the surface of the specimen can be regarded as a flat plate, the brightness is constant with regard to the beam scan position as shown in FIG. 12. Consequently, it is unlikely that the brightness varies with the beam scan position. Hence, it is impossible to perform signal processing effectively. There is the problem that it is impossible to bring the beam into focus.

SUMMARY OF THE INVENTION

It is an object of the present invention to provide an autofocus method which is adapted to be implemented in a scanning charged-particle beam instrument and which can precisely focus the beam onto a specimen even if the surface of the specimen can be regarded as a flat plate.

An autofocus method which is implemented according to one embodiment of the present invention and in a scanning charged-particle beam instrument produces an image of a specimen by scanning a beam of charged particles over the specimen, deriving data, and producing the image based on the data. This method starts with causing the focal condition of the beam on the specimen to be varied in steps. Whenever the condition is varied, a desired region of the specimen is scanned with the beam. Data obtained concomitantly with the scanning and a focus value corresponding to the focal condition produced at this time are stored as image data into a memory. The image data stored in the memory is read out and divided into plural sets of data on a data domain such that the sets of data correspond to plural subregions. With respect to each of the data sets of the image data, the characteristics of the brightness at plural kinds of focus values are found. The characteristics of a certain kind among the plural kinds of characteristics are accumulated for each focus value, and the average value is taken. The average value is taken as a focus function. The focus function is approximated by an arbitrary function. A focus value at a peak point is found from the arbitrary function. The focal condition of the charged-particle beam is set, based on the focus value.

According to the present invention, it is possible to precisely focus the beam onto the specimen even if the surface can be regarded as a flat plate.

Other objects and features of the invention will appear in the course of the description thereof, which follows.

DESCRIPTION OF THE PREFERRED EMBODIMENTS

The preferred embodiments of the present invention are hereinafter described in detail with reference to the drawings.

Figure 1:
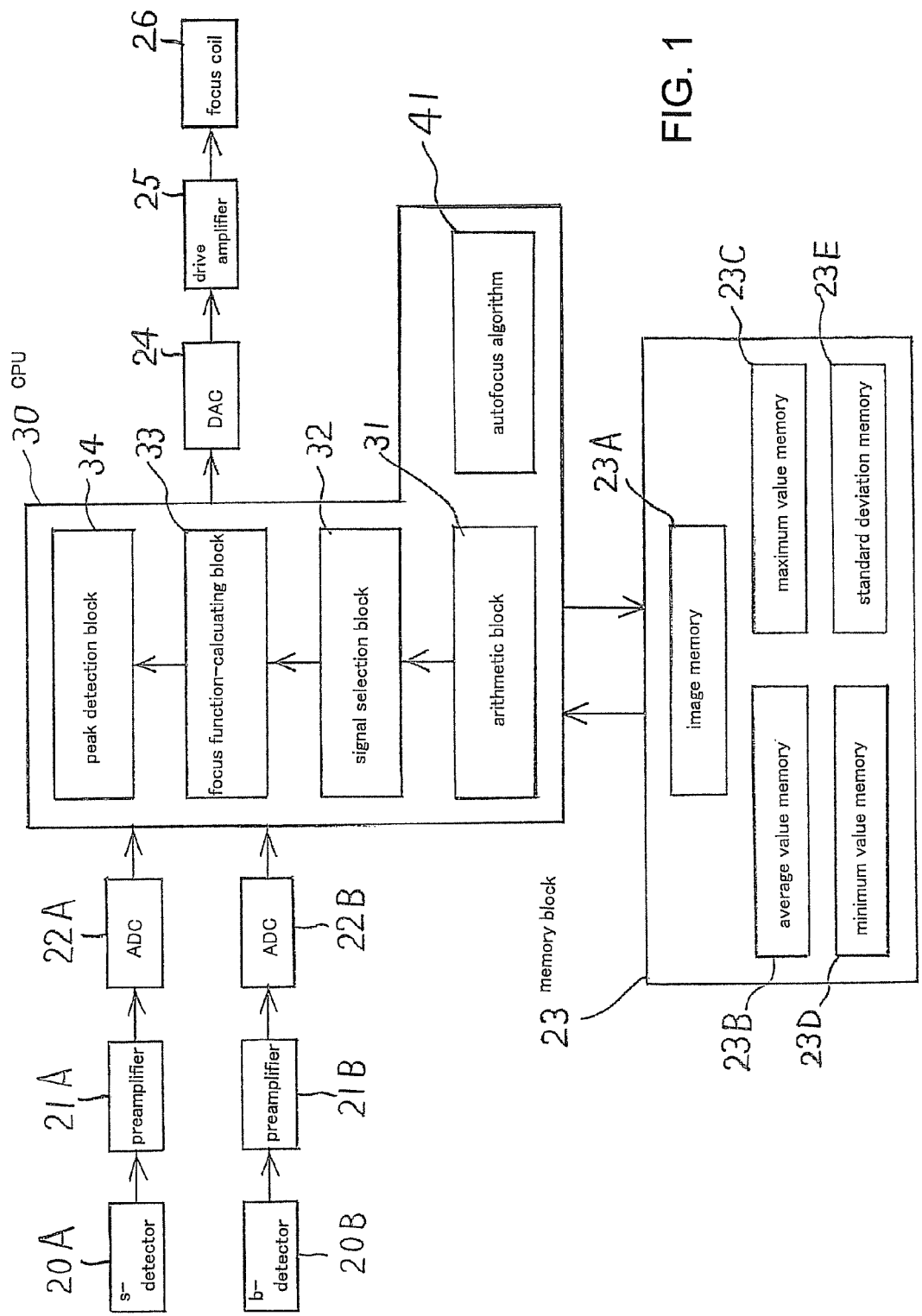
FIG. 1 is a block diagram of an autofocus system, according to one embodiment of the present invention, conceptually illustrating the configuration of the system.

FIG. 1 is a block diagram of an autofocus system, according to one embodiment of the present invention, conceptually illustrating the configuration of the system. The illustrated system has two detectors, e.g., a secondary electron detector 20A and a backscattered electron detector 20B. A secondary electron signal produced by the secondary electron detector 20A in response to detected secondary electrons is amplified by a preamplifier 21A and then converted into digital data by an A/D converter (ADC) 22A. The output from the A/D converter 22A is entered into a CPU 30 and once stored in a memory block 23. Then, the CPU 30 reads data about secondary electron images from the memory block 23 and performs computation for processing for automatic focusing in accordance with an autofocus algorithm 41 loaded in the CPU 30.

A signal indicating the result of the computation performed by the autofocus algorithm 41 loaded in the CPU 30 is converted into an analog signal by a D/A converter (DAC) 24. The analog signal is entered into a drive amplifier 25, which, in turn, drives a focus coil 26. The autofocus processing is carried out by the sequence of operations described so far. The configuration is similar to the prior art configuration except for the autofocus algorithm 41, which will be described later.

The principle of the autofocus algorithm featuring the present invention is first described. The algorithm exploits the physical nature that behavior of generation of a signal indicating electrons, such as secondary electrons or backscattered electrons, or an electrical current is affected by the focal condition.

Figure 2A:
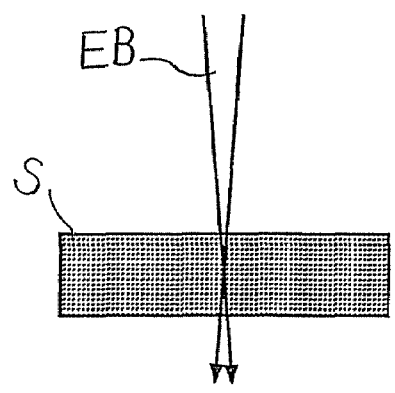
FIGS. 2A, 2B and 2C are diagrams illustrating the focal condition of an electron beam on a specimen.
Figure 2B:
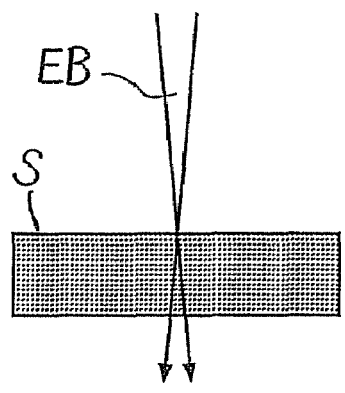
Figure 2C:
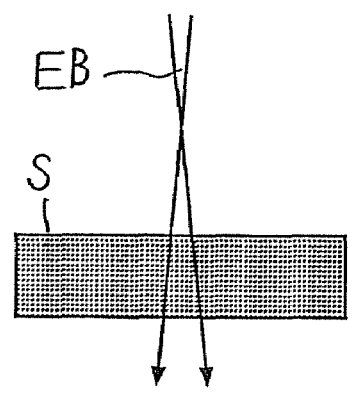

FIGS. 2A, 2B and 2C illustrate the definition of the focal condition of an electron beam EB impinging on a specimen S. FIG. 2A shows the state in which the beam is focused behind the specimen surface, i.e., a back focal point. FIG. 2B shows the state that the beam is in-focus condition. FIG. 2C shows the state that the beam is focused ahead of the specimen surface, i.e., a front focal point.

Figure 3A:
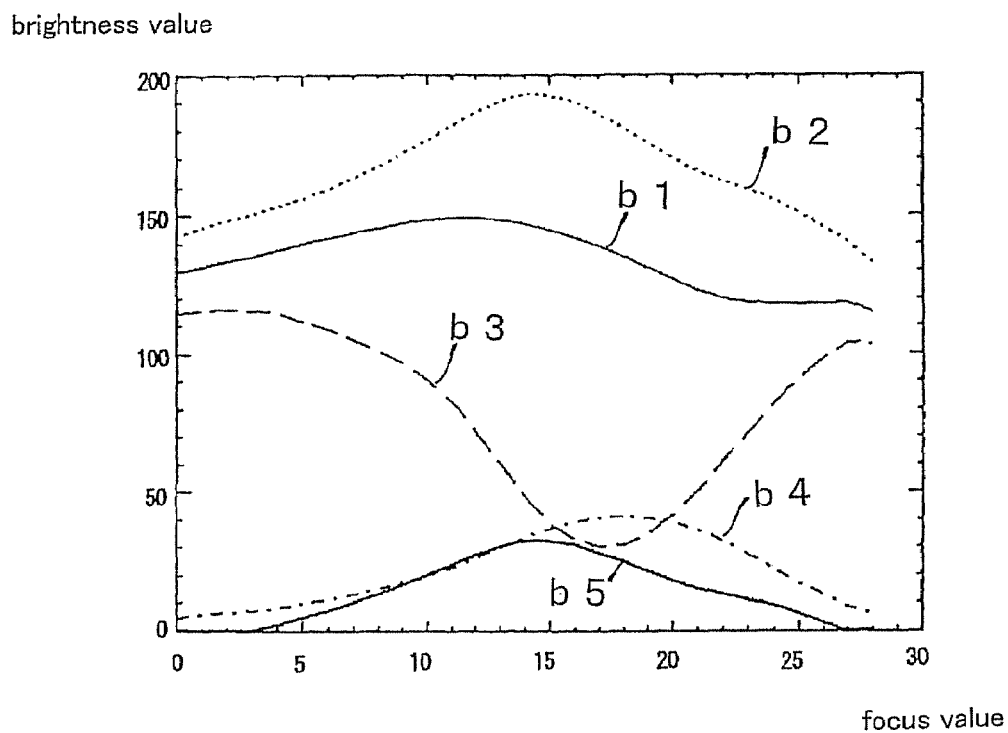
FIGS. 3A and 3B show graphs in which brightness is plotted against focus value used in a case where the specimen is a semiconductor and in another case in which the specimen has an edge.
Figure 3B:
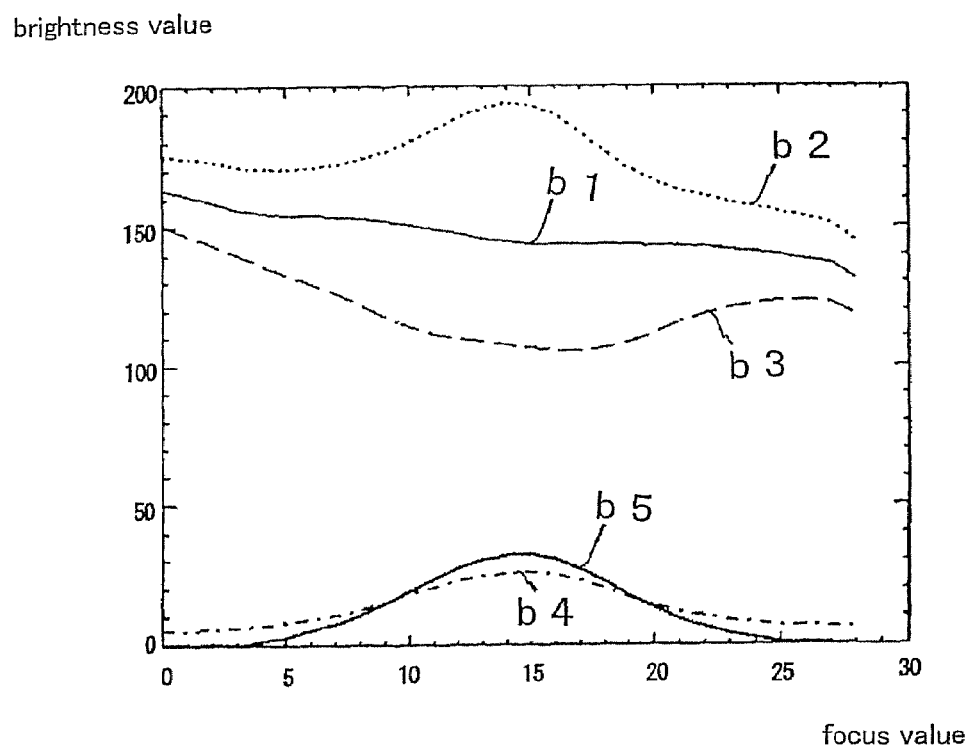

If the focal condition of the electron beam is varied in appropriate increments from the posteriorly focused condition to the anteriorly focused condition (or vice versa) through the in-focus condition, and if the beam is scanned over the specimen at each value for the beam, an amount of signal based on secondary electrons emanating from the specimen increases under the in-focus condition provided that the specimen is a flat specimen consisting of a flat semiconductor (FIG. 3A) or the specimen has an edge (FIG. 3B). For example, measuring the characteristics of the brightness value corresponding to the amount of signal derived from the whole scanned surface of each of the specimens against a focus value f results in characteristics, respectively, of FIGS. 3A and 3B.

In each of the graphs of FIGS. 3A and 3B, characteristic curve b1 indicates variations in the average brightness relative to the focus value. Characteristic curve b2 indicates variations in the maximum brightness relative to the focus value. Characteristic curve b3 indicates variations in the minimum brightness relative to the focus value. Characteristic curve b4 indicates variations in a normalized standard deviation of the brightness value relative to the focus value. Characteristic curve b5 shows a signal indicating variations in the brightness relative to the focus value obtained by an algorithm (described later) according to the present invention. The average brightness indicated by the characteristic curve b1 represents the average value of all signal intensities obtained at the various focus values. The maximum brightness indicated by the characteristic curve b2 represents the average value of stronger intensities (e.g., top 5% of (maximum value−minimum value)) of all the signal intensities obtained at the focus values. The minimum brightness indicated by the characteristic curve b3 represents the average value of lower intensities (e.g., bottom 5% of (maximum value−minimum value)) of all the signal intensities obtained at the focus values.

In the present invention, an appropriate characteristic curve is selected from the four characteristic curves b1, b2, b3, and b4 according to the algorithm (described later) of the present invention according to the specimen. The selected characteristic curve is signal-processed according to the inventive algorithm (described later), thus producing the aforementioned characteristic curve b5.

As can be seen from the characteristic curve b5, the brightness decreases on both sides of the maximum brightness. The focus value corresponding to the maximum brightness gives the in-focus condition. Accordingly, if a peak point is found from the characteristic curve b5, the in-focus condition can be found. Consequently, it is possible to bring the beam into sharp focus.

The brightness varies depending on the focal condition as mentioned previously. The brightness varies also depending on the substance of the specimen.

Figure 4:
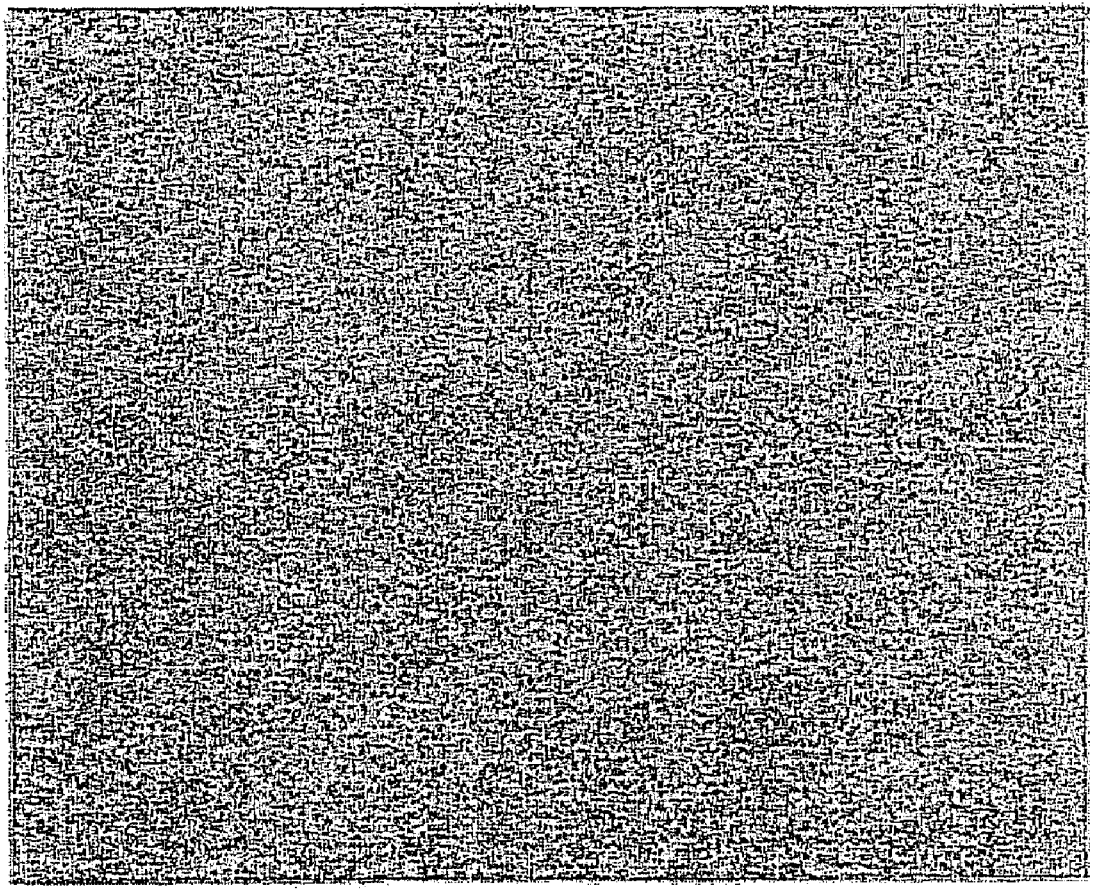
FIG. 4 is a digital representation of a secondary electron image of an aluminum film.

For example, FIG. 4 is a digital representation of a secondary electron image of an aluminum film. Generally, in the case of a flat metal, the brightness varies only a little and, therefore, it has been heretofore impossible to bring the electron beam into focus.

Figure 5A:
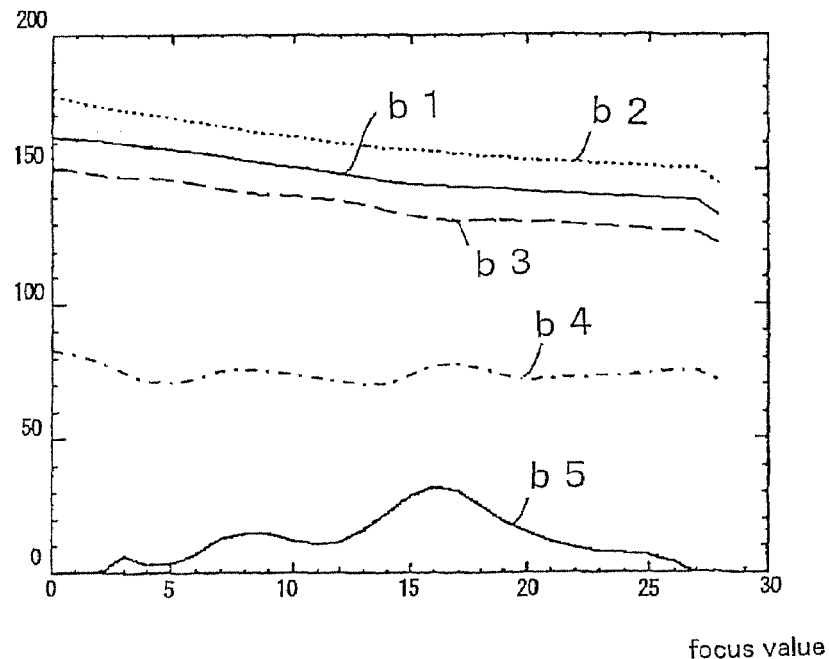
FIGS. 5A and 5B show graphs illustrating various variations in brightness of a flat aluminum surface when a focus value is varied.
Figure 5B:
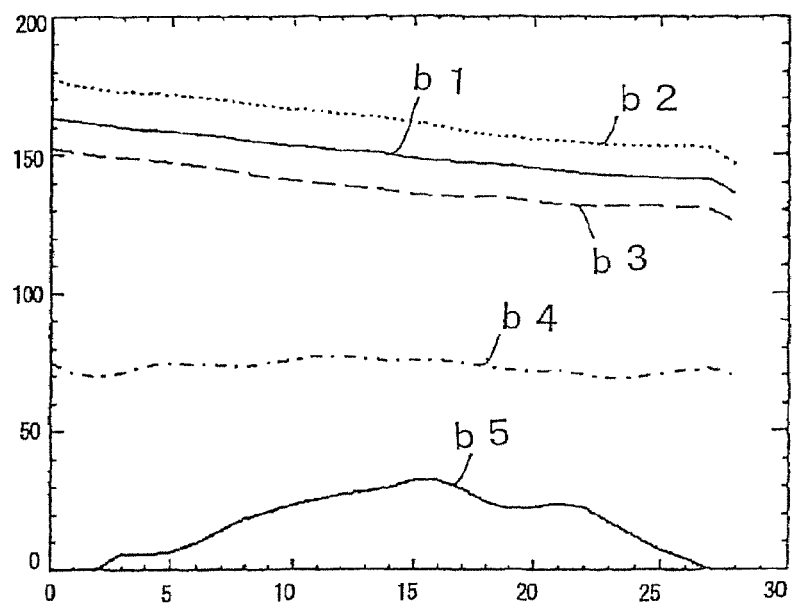

The graphs of FIGS. 5A and 5B show various characteristic curves of the brightness when the electron beam focused onto a specimen made of the aluminum film is varied from posteriorly focused condition to anteriorly focused condition as mentioned previously. It can be seen that the four characteristic curves b1, b2, b3, and b4 hardly vary.

Figure 6A:
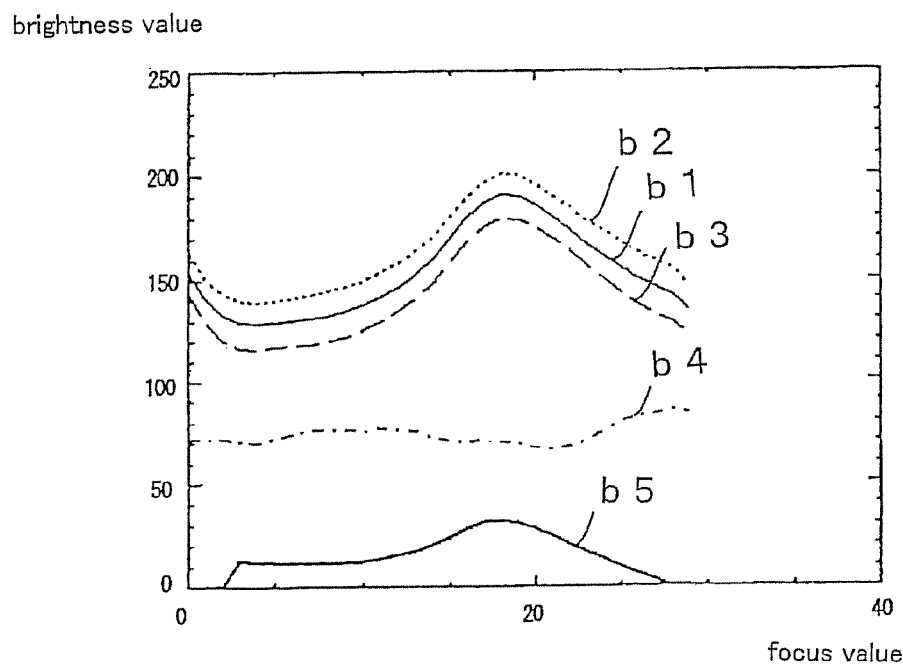
FIGS. 6A and 6B show graphs illustrating various variations in brightness of a flat insulator surface when a focus value is varied.
Figure 6B:
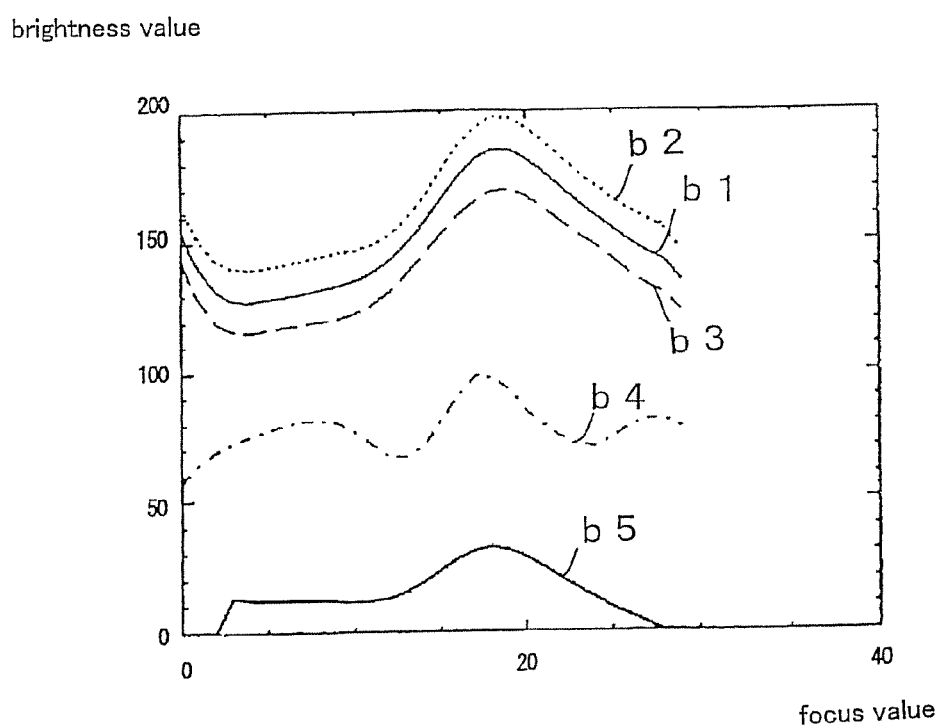

However, if an appropriate characteristic curve is selected from the four characteristic curves b1, b2, b3, and b4 according to the inventive autofocus algorithm (described later) and the selected characteristic curve is signal-processed according to the inventive autofocus algorithm, it is possible to cause buried signals to show up. The focal characteristic curve b5 having a clear peak can be obtained. An exact focal point can be found by searching for peak points.

Where the specimen is an insulator, four characteristic curves b1, b2, b3, and b4 as shown in FIGS. 6A and 6B are obtained. An appropriate characteristic curve is selected from the four characteristic curves b1, b2, b3, and b4 according to the inventive autofocus algorithm (described later). The selected characteristic curve is signal-processed according to the inventive autofocus algorithm (described later). Thus, the characteristic curve b5 can be obtained. It can be seen from the characteristic curve b5 that the brightness increases rapidly with approaching the focal point because charging takes place on an insulator. Therefore, in the case of such a specimen, the exact focal point can be found by searching for peak points.

The autofocus algorithm (indicated by 41 in FIG. 1), according to the present invention, is next described in detail. The aforementioned four characteristic curves indicating (1) variations in the average brightness relative to the focus value, (2) variations in the maximum brightness relative to the focus value, (3) variations in the minimum brightness relative to the focus value, and (4) variations in a normalized standard deviation of the brightness value relative to the focus value are used as signals for use in autofocusing processing. If any other signal is available, it can be used. The present algorithm can be similarly applied to semiconductor specimens, metal specimens, and insulator specimens.

Figure 7:
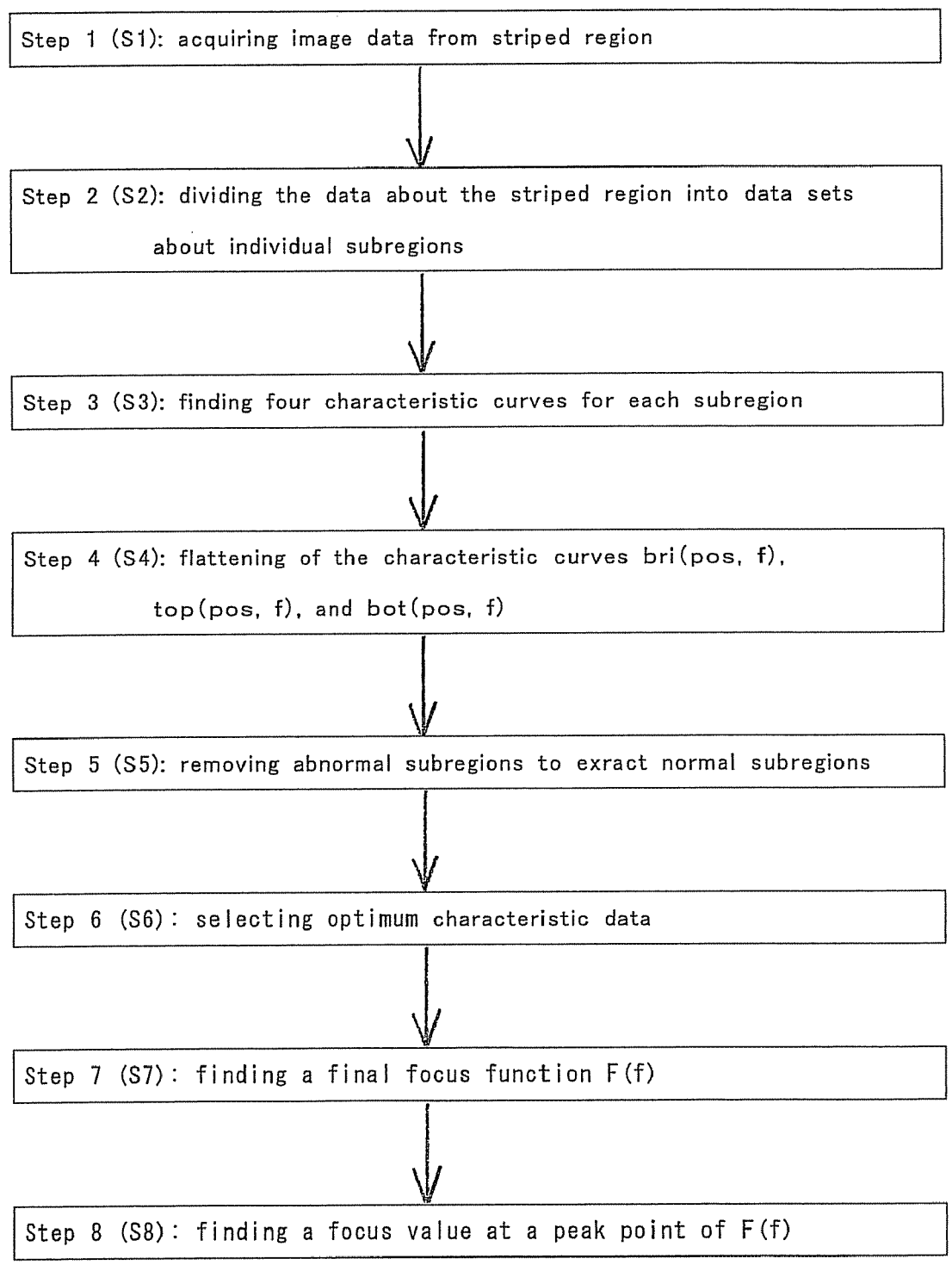
FIG. 7 is a flowchart illustrating one example of a sequence of operations for automatic focusing, according to one embodiment of the present invention.

FIG. 7 is a flowchart illustrating one example of sequence of operations for automatic focusing, according to the present invention.

<Step 1 (S1) for Acquiring Image Data from Striped Region>

In the present invention, when an electron beam is scanned over a specimen, a striped region of the specimen is scanned to shorten the time instead of a wide region. A secondary particle signal (such as a secondary electron signal) is obtained from the striped region.

First, the Y-direction offset is set to 0 when the striped region is being scanned. The focal position f is set to 0. This corresponds to the back focal point.

Then, the focal position f of the electron beam is shifted in given increments of $\Delta f$ from the back focal point (f=0) toward the front focal point. Whenever the position is shifted, the beam is scanned over a given striped region of the specimen. Secondary electrons produced from the specimen during the scanning are detected by a secondary electron detector 20A. For example, the striped region is made up of 32×640 pixels.

Image data Image (x, y, f) (where x and y are x and y coordinates within the striped region) derived from the striped region and based on the output signal from the detector 20A is stored in an image memory 23A of the memory block 23 under instructions from the CPU 30. In the present embodiment, two-dimensional scanning is performed at every focal position f. Similar data can be obtained if the focal position f is varied at every coordinate (x, y).

<Step 2 (S2) for Dividing the Data about the Striped Region into Data Sets about Individual Subregions>

Figure 8:
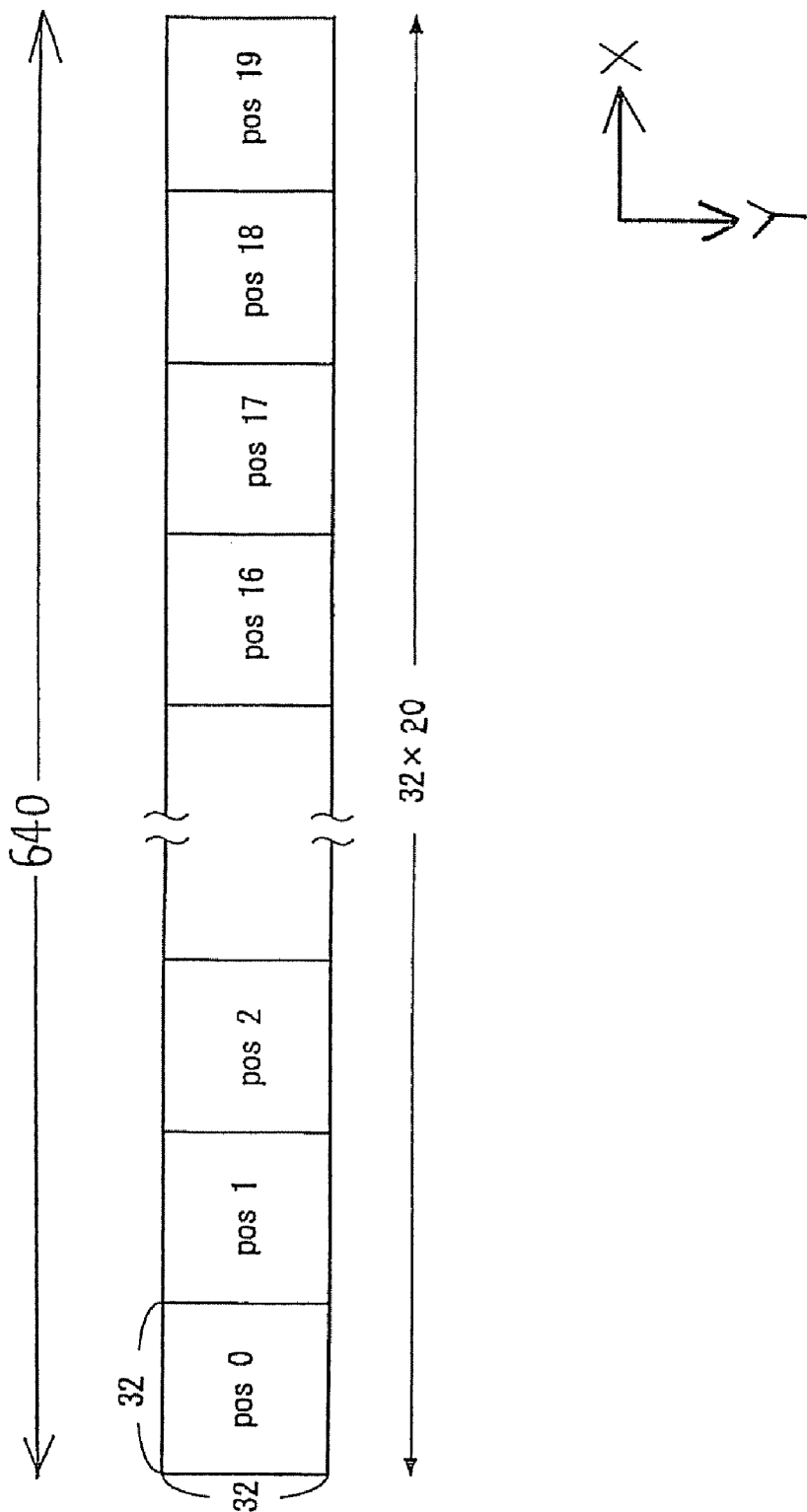
FIG. 8 is a diagram illustrating a striped region.
Figures 9A, 9B:
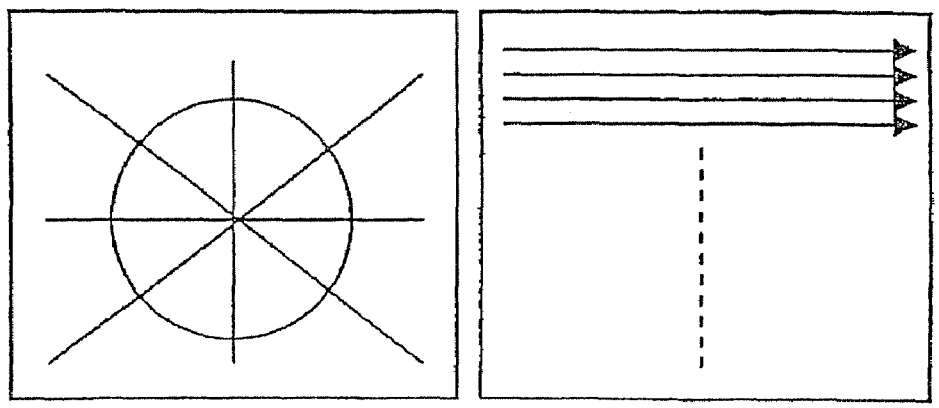
FIGS. 9A and 9B illustrate scanning of an electron beam when an autofocus operation is performed.
Figure 10:
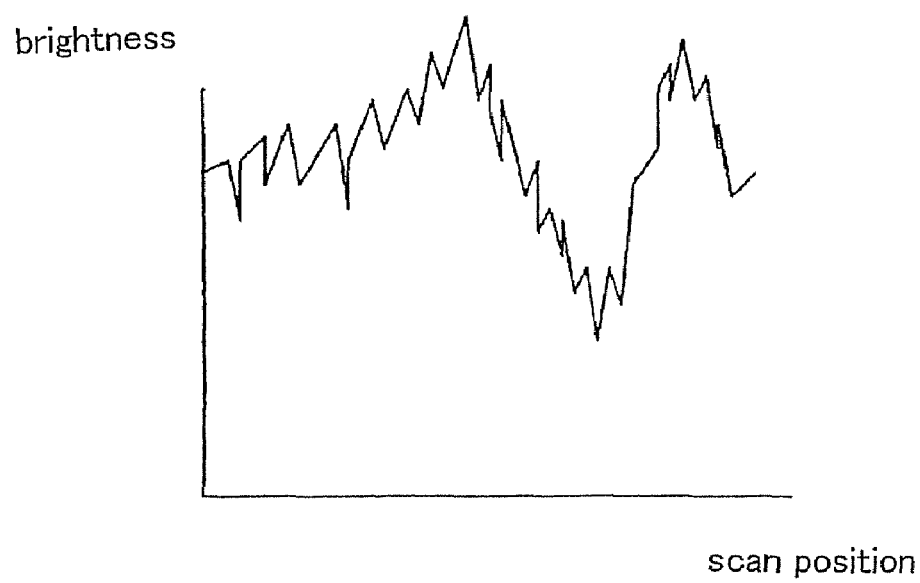
FIG. 10 is a graph showing the brightness of a secondary signal obtained at each beam scan position.
Figure 11:
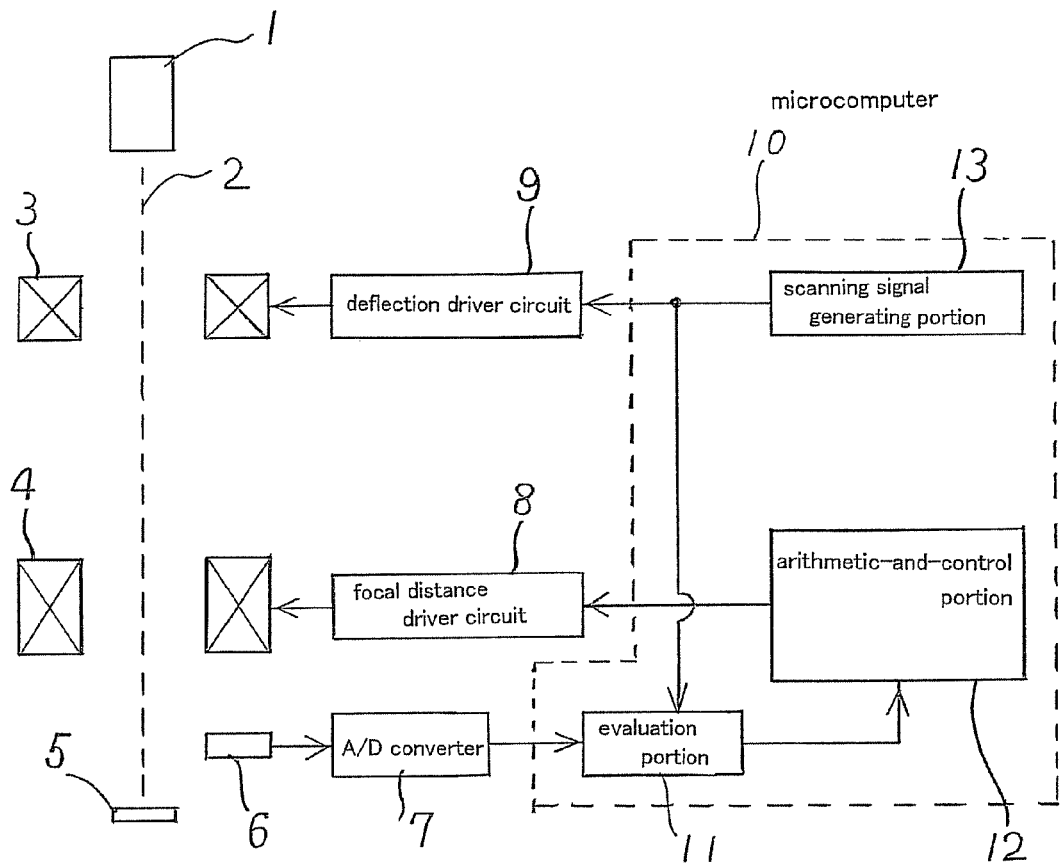
FIG. 11 is a block diagram of an example of a prior art configuration of an autofocus system for use in a scanning electron microscope.
Figure 12:
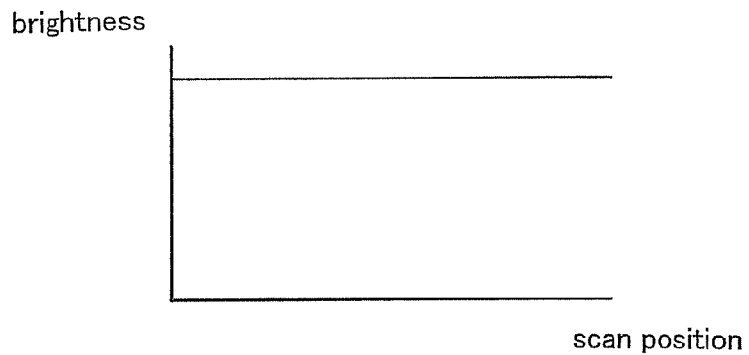
FIG. 12 is a graph in which the brightness is plotted against beam scan position in a case where the surface of an object is a mirror-like surface.

Then, the CPU 30 reads the image data Image (x, y, f) from the image memory 23A, the image data being about the 32×640 pixels of the striped region. The image data read out is divided into data sets each representing a subregion of 32×32 pixels by an arithmetic block 31 included in the CPU 30. FIG. 8 illustrates the striped region consisting of 32×640 pixels. In FIG. 8, "pos" indicates an index of a subregion consisting of 32×32 pixels. The striped region is divided into 20 subregions starting with pos0 and ending with pos19.

<Step 3 (S3) for Finding Four Characteristic Curves for Each Subregion>

The arithmetic block 31 finds signals indicating variations in the average brightness relative to the focus value (referred to as focus-average brightness characteristics b1), variations in the maximum brightness relative to the focus value (referred to as focus-maximum brightness characteristics b2), variations in the minimum brightness relative to the focus value (referred to as focus-minimum brightness characteristics b3), and variations in the standard deviation of the brightness value relative to the focus value (referred to as focus-brightness standard deviation characteristics b4) for each of the 20 subregions. That is, based on the image data Image (x, y, f), the arithmetic block finds focus-average brightness characteristic data bri ($pos_1$, $f_0$) to bri ($pos_{20}$, $f_m$), focus-maximum brightness characteristics top ($pos_1$, $f_0$) to top ($pos_{20}$, $f_m$), focus-minimum brightness characteristics bot ($pos_1$, $f_0$) to bot ($pos_{20}$, $f_m$), and focus-brightness standard deviation characteristics stv ($pos_1$, $f_0$) to stv ($pos_{20}$, $f_m$).

These four sets of data, i.e., focus-average brightness characteristic data, focus-maximum brightness characteristic data, focus-minimum brightness characteristic data, and focus-brightness standard deviation characteristic data, are stored in average value memory 23B, maximum value memory 23C, minimum value memory 23D, and standard deviation memory 23E, respectively, of the memory block 23 under instructions from the CPU 30.

<Step 4 (S4) for Flattening of the Characteristic Curves Bri (pos, f), top (pos, f), and bot (pos, f)>

Then, the CPU 30 reads the focus-average brightness characteristic data, focus-maximum brightness characteristic data, and focus-minimum brightness characteristic data from the memories 23B, 23C, and 23D, respectively. The arithmetic block 31 flattens these four characteristic curves by approximating the four characteristic curves by straight lines and subtracting values of straight lines from the former straight lines. The processing is intended to remove the effects of brightness variations. It is unnecessary to flatten the focus-brightness standard deviation characteristics.

<Step 5 (S5) for Removing Abnormal Subregions to Extract Normal Subregions>

The arithmetic block 31 then scrutinizes all the four kinds of focal characteristics obtained for each subregion and rules out abnormal subregions. In this step, a decision is made as to whether at least one of the four kinds of focus characteristics is a convex function at the focal position f, for every subregion. Furthermore, a decision is made as to whether the peak of the convex function is present within the scanned region. Only subregions satisfying these two conditions are extracted as normal subregions.

<Step 6 (S6) for Selecting Optimum Characteristic Data>

A signal selection block 32 of the CPU 30 then selects characteristic data best adapted for execution of autofocusing processing from the focus-average brightness characteristic data bri (pos, f), focus-maximum brightness characteristic data top (pos, f), focus-minimum brightness characteristic data bot (pos, f), focus-brightness standard deviation characteristic data stv (pos, f) supplied from the arithmetic block 31 according to an optimum signal selection routine. If the same characteristic data are used at all times, it is highly likely that any peak cannot be detected under certain conditions with unsuccessful results. Accordingly, it is important to use a selective algorithm of selecting appropriate characteristic data according to conditions.

The following algorithms are conceivable as this selective algorithm.

1) In cases where the amount of variation of the average brightness is great (such as where the specimen is a semiconductor or an insulator):

(a) Where the focus-average brightness characteristics bri (pos, f) are given by a convex function and there is any peak, the focus-maximum brightness characteristic data top (pos, f) are selected.

(b) Where the focus-average brightness characteristics bri (pos, f) are given by a concave function and there is any valley, an inversion of the focus-minimum brightness characteristic data bot (pos, f) is selected.

2) Where the amount of variation of the average brightness is small (such as when the specimen is made of a metal or a metal-based material):

(a) Where the focus-brightness standard deviation characteristic data stv (pos, f) are large, the focus-brightness standard deviation characteristic data stv (pos, f) are selected.

(b) Where (i) the focus-brightness standard deviation characteristic data stv (pos, f) have small values, (ii) the focus-minimum brightness characteristic data bot (pos, f) vary beyond a certain value, and (iii) the focus-average brightness characteristics bri (pos, f) are given by a concave function, an inversion of the focus-minimum brightness characteristic data bot (pos, f) is selected.

(c) Where (i) the focus-brightness standard deviation characteristic data stv (pos, f) have small values, (ii) the focus-maximum brightness characteristic data top (pos, f) vary beyond a certain value, and (iii) the focus-average brightness characteristics bri (pos, f) are given by a convex function, the focus-maximum brightness characteristic data top (pos, f) are selected.

(d) In cases other than the cases (a), (b) and (c), it is determined that it is impossible to perform the autofocus processing.

<Step 7 (S7) for Finding a Final Focus Function F(f)>

Then, a focus function-calculating block 33 of the CPU 30 normalizes the focus-brightness characteristic data selected by the signal selection block 32 and accumulates the data for each focus value, thus averaging the data. The focus-brightness characteristic data averaged in this way are referred to as the final focus function.

<Step 8 (S8) for Finding a Focus Value at a Peak Point of F(f)>

A peak detection block 34 of the CPU 30 then approximates the final focus function F (f) by a quadratic function, finds a peak point from the quadratic function, and finds a focus value at the peak point. Where locally strong plural peaks are obtained, a value obtained by averaging the focus values at the peaks is taken as an in-focus value.

Data about excitation of the found focus value is sent by the peak detection block 34 to the focus coil 26 via the D/A converter 24 and via the drive amplifier 25. As a result, the specimen is scanned with the exactly focused electron beam.

The peak detection block 34 checks if the obtained peak value is smaller than a given threshold value. If so, i.e., the peak value is smaller than the threshold value, it is impossible to find any reliable in-focus value. Therefore, another striped region on the specimen is selected, and the steps S1-S8 are repeatedly performed. At this time, a decision is made as to whether the number of repetitions has reached a given number. If any peak value greater than the threshold value is not obtained after the number of repetitions has reached the given number, it is determined that an abnormal situation has occurred. The focusing operation is terminated. If the number of repetitions does not reach the given number, the Y-direction offset used during the scanning of the striped region is set to $64 \times (N/2) \times (-1)^N$, where N is the number of repetitions. That is, striped regions vertically spaced from each other are alternately scanned, using Y-direction offset values that are multiples of 64.

In the above-described embodiment, a secondary electron signal produced by a secondary electron detector is used as a signal for use in the autofocus processing. The present invention is not limited to this kind of signal. For example, a backscattered electron signal, absorbed electron signal, or any other signal varying with the focal condition may also be used.

Furthermore, by finding a focal point for each minute region, relative heights of the minute regions can be found. That is, three-dimensional data can be found. Consequently, a three-dimensional structure can be reproduced. This can be used for measurement of the height at an arbitrary point.

In addition, the steps 4 and 5 can be interchanged in order.

In the step 8 (S8), the final focus function is approximated by a quadratic function. Other arbitrary function, such as a curvilinear function or Nth-order function, may also be used.

In the step 7 (S7), the focus function-calculating block 33 normalizes the focus-brightness characteristic data selected by the signal selection block 32 and accumulates the normalized data for each individual focus value to obtain the final focus function. Alternatively, the final focus function may be found as follows.

A focus value corresponding to a peak value is found based on the focus-brightness characteristic data selected by the signal selection block 32 for each one of normal subregions. The frequency of each subregion is found for each focus value. That is, a histogram showing the distribution of focus values of the subregions is created. A focus value having the highest frequency is extracted from the histogram. Data about the subregions having the focus value are averaged to obtain a final focus function. In this case, the focus value having the highest frequency may be taken as an in-focus value.

Normally, a scanning charged-particle beam instrument is equipped with auto-stigmation function as well as autofocus function. Both functions are similar in operation except for the used lens. In the auto-focus function, a focusing lens (objective lens) is used, while in the auto-stigmation function, X- and Y-direction stigmator lenses are used. Therefore, it is needless to say that stigmation correction can be made precisely even if the surface of the specimen can be regarded as a flat plate by varying the strengths of excitation currents to the X- and Y-direction stigmator lenses in increments and then performing operations similarly to the above-described auto-focus operations.

Furthermore, by finding a focal point for each subregion, relative heights of the subregions can be found. That is, three-dimensional data can be found. Consequently, a three-dimensional structure of the specimen surface can be reproduced. This can be used for measurement of the height at an arbitrary point over the specimen surface.

The autofocus method, according to the present invention, can be applied to other scanning charged-particle beam instrument for scanning a charged-particle beam over a specimen including a material to be machined or processed, such as a material to be photolithographically processed, as well as to a scanning electron microscope.

As described so far, the present invention yields the following advantages.

1) Because it is possible to focus a beam even onto a specimen having no pattern, autofocus processing can be performed even on a mirror-like specimen, which would have been heretofore difficult to achieve by the prior art autofocusing technique.

2) Because the autofocus processing is performed based on an image signal derived by scanning a striped region on a specimen with an electron beam, the autofocus processing can be completed in a short time.

3) Improved S/N can be achieved because plural kinds of characteristics found from individual subregions are checked, characteristic data about abnormal subregions are excluded, and only normal subregions are used for autofocus operations. The autofocus processing can be carried out if the specimen is any of a metal, a semiconductor, and an insulator.

4) Because an in-focus point is found for searching for a peak of a focus function, the exact focal point can be found accurately even if the focal point is varied in large increments.

As described in detail so far, the present invention can offer an autofocus method which is implemented in a scanning charged-particle beam instrument and which can bring a beam into a focus even on a specimen surface that can be regarded as flat.

Having thus described our invention with the detail and particularity required by the Patent Laws, what is desired protected by Letters Patent is set forth in the following claims.

The invention claimed is:

1. An autofocus method adapted to be implemented in a scanning charged-particle beam instrument for obtaining an image of a specimen based on data obtained by scanning a charged-particle beam over the specimen, said autofocus method comprising the steps of:
   causing focal condition of the charged-particle beam to be varied in steps over the specimen;
   scanning a given region over the specimen with the charged-particle beam whenever the focal condition is varied;
   storing data obtained concomitantly with the scanning and a focus value corresponding to this focal condition into a memory as image data;
   reading the image data from the memory and dividing the data into plural sets of data on a data domain such that the sets of data correspond to plural subregions;
   finding characteristics of brightness at plural kinds of focus values for each of the plural sets of data;
   accumulating characteristics of a certain kind among the plural kinds of characteristics for each focus value;
   averaging the accumulated characteristics and taking the averaged characteristics as a focus function;
   approximating the focus function by an arbitrary function;
   finding a focus value at a peak point from the arbitrary function; and
   setting the focal condition of the charged-particle beam based on the found focus value.

2. An autofocus method adapted to be implemented in a scanning charged-particle beam instrument as set forth in claim 1, wherein said found characteristics are flattened by approximating the characteristics by straight lines and subtracting values of straight lines.

3. An autofocus method adapted to be implemented in a scanning charged-particle beam instrument as set forth in claim 1, wherein
   (A) a decision is made for each of the subregions as to whether or not at least one of the plural kinds of characteristics is a convex function,
   (B) a check is made to see whether a peak of the function is present within a region scanned with the charged-particle beam,
   (C) characteristic data of a certain kind derived from the subregions satisfying these conditions are accumulated for each focus value,
   (D) the accumulated characteristic data are averaged, and
   (E) the average characteristic data are taken as a focus function.

4. An autofocus method adapted to be implemented in a scanning charged-particle beam instrument as set forth in claim 1, wherein
   (A) any one or all of (i) focus value-average brightness characteristics, (ii) focus value-maximum brightness characteristics, (iii) focus value-minimum brightness characteristics, and (iv) focus value-standard deviation characteristics are used as plural kinds of characteristics of brightness relative to a focus value,
   (B) an optimum kind of characteristics is selected from the used characteristics, and
   (C) the selected kind of characteristics is accumulated for each focus value and averaged, whereby a focus function is created.

5. An autofocus method adapted to be implemented in a scanning charged-particle beam instrument as set forth in claim 1, wherein
   (A) the characteristics of the brightness relative to the plural kinds of focus values are (i) characteristics of an average brightness relative to focus value, (ii) characteristics of a maximum brightness relative to focus value, (iii) characteristics of a minimum brightness relative to focus value, and (iv) characteristics of a standard deviation relative to focus value,
   (B) (i) the characteristics of the average brightness relative to focus value, (ii) the characteristics of the maximum brightness relative to focus value, and (iii) the characteristics of the minimum brightness relative to focus value of these four kinds of characteristics are flattened,
   (C) an optimum kind of characteristics is selected from a group consisting of the three kinds of flattened characteristics and the characteristics of the standard deviation relative to the focus value, and
   (D) the selected kind of characteristics is accumulated at each focus value and averaged, whereby a focus function is created.

6. An autofocus method adapted to be implemented in a scanning charged-particle beam instrument as set forth in any one of claims 4 and 5, wherein said optimum kind of characteristics is selected in such a way (a) that if (i) the specimen is a semiconductor or an insulator, (ii) the characteristics of the average brightness relative to the focus value are given by a convex function, and (iii) there is a peak, then the characteristics of the maximum brightness relative to the focus value are selected (b) and that if (i) the specimen is a semiconductor or an insulator, (ii) the characteristics of the average brightness relative to the focus value are given by a concave function, and (iii) there is a valley, then an inversion of the characteristics of the minimum brightness relative to the focus value is selected.

7. An autofocus method adapted to be implemented in a scanning charged-particle beam instrument as set forth in any one of claims 4 and 5, wherein said optimum kind of characteristics is selected in such a way that (c) if the specimen is a metal or a metal-based material, and if the characteristics of the standard deviation relative to the focus value are large, the characteristics of the standard deviation relative to the focus value are selected, (d) if (i) the specimen is a metal or a metal-based material, (ii) the characteristics of the standard deviation relative to the focus value are small, (iii) the characteristics of the optimum brightness relative to the focus value vary beyond a certain value, and (iv) the characteristics of the average brightness relative to the focus value are given by a concave function, then an inversion of the characteristics of the minimum brightness relative to the focus value is selected, (e) if (i) the specimen is a metal or a metal-based material, (ii) the characteristics of the standard deviation relative to the focus value are small, (iii) the characteristics of the maximum brightness relative to the focus value vary beyond a certain value, and (iv) the characteristics of the average brightness relative to the focus value are given by a convex function, the characteristics of the maximum brightness relative to the focus value are selected, and (f) autofocus capability is disabled in cases other than the cases (c)-(e).

8. An autofocus method adapted to be implemented in a scanning charged-particle beam instrument as set forth in claim 1, wherein the given region of the specimen scanned with the charged-particle beam is a striped region which is divided in a direction perpendicular to a longitudinal direction on a data domain.

9. An autofocus method adapted to be implemented in a scanning charged-particle beam instrument as set forth in claim 8, wherein said subregions are rectangular in shape.

10. An autofocus method adapted to be implemented in a scanning charged-particle beam instrument as set forth in claim 1, wherein said arbitrary function is an N-th order curve.

11. An autofocus method adapted to be implemented in a scanning charged-particle beam instrument as set forth in claim 10, wherein said N-th order curve is a quadratic curve.

12. An autofocus method adapted to be implemented in a scanning charged-particle beam instrument as set forth in claim 1, wherein when said arbitrary function has plural peaks, the focal condition of the charged-particle beam is set based on an average value of the focus values at the peaks.

13. An autofocus method adapted to be implemented in a scanning charged-particle beam instrument as set forth in claim 1, wherein a final focus function is obtained by finding a focus value corresponding to a peak point based on a certain kind of characteristic data for each of the subregions, finding a frequency distribution of focus values in each subregion, extracting a focus value having the highest frequency from the distribution, and averaging data about the subregions having this focus value.

14. An autofocus method adapted to be implemented in a scanning charged-particle beam instrument as set forth in claim 13, wherein the focal condition of the charged-particle beam is set based on the focus value having the highest frequency.

* * * * *